(12) United States Patent
Burlison et al.

(10) Patent No.: US 6,880,137 B1
(45) Date of Patent: Apr. 12, 2005

(54) DYNAMICALLY RECONFIGURABLE PRECISION SIGNAL DELAY TEST SYSTEM FOR AUTOMATIC TEST EQUIPMENT

(75) Inventors: Phillip D. Burlison, Morgan Hill, CA (US); Jason E. Doege, Austin, TX (US)

(73) Assignee: Inovys, Pleasanton, CA (US)

( * ) Notice: Subject to any disclaimer, the term of this patent is extended or adjusted under 35 U.S.C. 154(b) by 0 days.

(21) Appl. No.: 10/210,976

(22) Filed: Aug. 2, 2002

Related U.S. Application Data

(60) Provisional application No. 60/310,137, filed on Aug. 3, 2001.

(51) Int. Cl.[7] ............................................. G06F 12/50
(52) U.S. Cl. ........................... 716/4; 702/119; 714/724; 714/726
(58) Field of Search ..................... 716/4, 5, 6; 702/119; 714/724, 726, 727, 731, 732, 744

(56) References Cited

U.S. PATENT DOCUMENTS

| | | | | |
|---|---|---|---|---|
| 6,084,930 A | * | 7/2000 | Dinteman | 375/354 |
| 6,115,836 A | * | 9/2000 | Churchill et al. | 714/726 |
| 6,591,213 B1 | * | 7/2003 | Burlison | 702/119 |
| 6,598,192 B1 | * | 7/2003 | McLaurin et al. | 714/726 |
| 2003/0110427 A1 | * | 6/2003 | Rajsuman et al. | 714/724 |

* cited by examiner

*Primary Examiner*—Vuthe Siek
(74) *Attorney, Agent, or Firm*—Wagner, Murabito & Hao LLP

(57) ABSTRACT

A programmable time event and waveform generator for the application of precise timing patterns to a logic circuit and the capture of response data from the logic circuit. The time event and waveform generator comprises a programmable delay element that is programmed with values stored in pattern memory. For scan based testing, the time event and waveform generator is programmed between test pattern scan sequences by serial loading from the test pattern memory. The generator may be used to generate precise signal transitions to input pins of a circuit under test, and to capture at precise times the signal states from the output pins of a circuit under test. The data for programming the delay element is accessed from test pattern memory.

15 Claims, 19 Drawing Sheets

DYNAMICALLY RECONFIGURABLE PRECISION SIGNAL DELAY TEST SYSTEM FOR AUTOMATIC TEST EQUIPMENT

RELATED U.S. PATENT APPLICATION

This application claims the benefit of Provisional Application No. 60/310,137, filed Aug. 3, 2001.

FIELD OF THE INVENTION

The present invention relates to Automatic Test Equipment (ATE) used to test digital semiconductor integrated circuits (IC's). More specifically, the invention is directed to systems for performing precision digital signal delay testing on ICs that incorporate Design For Testability (DFT).

BACKGROUND ART

ATE for digital integrated circuits are required to provide digital stimulus to the integrated circuit (IC) and to measure the resultant digital response from the IC. One goal of this testing is to verify that there are no defects present in the IC that could affect its ability to perform its intended function. A second objective of testing is to verify that the IC will operate under its specified timing conditions. That is, verify that an IC not only performs the correct function, but performs it fast enough to meet its specification.

Prior Art FIG. 1 depicts a diagram 100 of a simplified synchronous digital IC. The IC structure comprises a clock input 105, digital input pins 110, internal data storage elements 115 (data registers), combinatorial logic 120 (gates, multiplexers, etc.) and digital output pins 125.

Prior Art FIG. 2 shows a diagram 200 of the operation of the data registers 115 of Prior Art FIG. 1. The data input 205 to the data register 210 is captured on the rising edge 215 of each clock cycle of the clock input signal 220 and transferred to the register output 225. Thus, data is shifted from one register to another on each clock event. While the example depicted is rather simple, actual IC designs typically employ several hundred input/output data pins and several thousands of internal registers.

Prior Art FIG. 3 depicts several critical timing parameters that are tested on the typical digital IC. A specification on any IC pin may or may not be different from the other pins.

For the clock input 305, $t_{cycle}$ specifies the minimum period of time in which data can be transferred from one internal register output, through the combinatorial logic circuitry, and into the next internal data register.

For data input signals 310, $t_{su}$, is the minimum amount of time that stimulus data must be valid at the input of the IC prior to the clock transition to ensure that the correct data state will be captured. For data input signals 310, $t_{dh}$ is the minimum amount of time that stimulus data must be held valid at the input of the IC after the clock transition to ensure that the correct data state will be captured.

For data input signals 315, $t_{pd}$ is the maximum amount of time (e.g., the maximum propagation delay) that IC output data takes to become valid at the output after the clock transition.

For data output signals 315, $t_{doh}$ is the minimum amount of time that IC output data will maintain its previous state at the output of the IC after to the clock transition.

The method used to test the IC described above is referred to as functional testing. Functional testing requires that the test system simultaneously provide input data on all of the inputs pins at the specified data rate, and under the specified timing conditions. The tester is also required to compare the data outputs at the specified times against expected data results. Since an IC may have several hundred input/output signals, and potentially require more complex timing than described above, the complexity of test systems used for functional testing can be very high.

Prior Art FIG. 4 depicts a diagram 400 of a conventional test system used to perform functional testing. A common programmable Cycle Generator 405 establishes the test pattern data rate ($t_{cycle}$) and addresses the test pattern memory 425 through and address pointer 406. Each individual tester pin 410 is implemented with multiple independently programmable timing generators in order to generate the precise timing events required. Each tester pin may typically each have 3–6 timing generators 415. Another capability implemented is the ability to dynamically select different cycle and timing values from one cycle to another from a finite set of values stored in a memory 420 (referred to as Time set memory). The Time set memory location is selected on each data cycle by dedicated bits output by the test pattern memory 425 over a time set memory address bus 430. Depending on the specific implementation, the test pattern memory 425 may provide a unique address for each pin's time set memory, or a common address for all pins.

The most common design for test (DFT) implementation is scan based design. To address the problems of increasing IC complexity and test cost, some IC manufacturers incorporate DFT into their IC designs. DFT is additional circuitry added to the design to assist in the testing of the IC.

Prior Art FIG. 5 depicts a diagram 500 of an IC similar to that shown in FIG. 1, with an added internal scan capability. Note that a data multiplexer 505 has been added to the input of each register 515. In normal mode (scan enable is de-asserted) the multiplexer 515 connects the input of the register to the output of the combinatorial logic 520. During scan pattern loading (scan enable is asserted), this multiplexer connects the input of the register to the output of an adjoining register. This converts the registers into a single serial shift register which can be loaded through a single scan data input pin 535 and read out through a scan data output pin 540. Note that it is common practice in some designs to break up the scan shift registers into multiple, shorter shift chains with added scan in/out data pins.

Prior Art FIG. 6 depicts a set of data waveforms 600 with an associated clock 615 that may be applied when using the scan pins to test the IC. To execute one scan test pattern, the scan enable signal 605 is asserted (high) to enable the scan input. A test pattern 610 is shifted into the internal registers via the scan data input pin (in the example depicted in FIG. 5, this would require 22 data cycles). After the registers have been loaded, one clock cycle is executed with scan enable de-asserted (low) and with test data 620 applied to the data inputs. This clock cycle captures the outputs of the combinatorial logic that has been stimulated with the data pattern shifted into the registers as well as the data on the data input pin. The data on the output pins 625 is also sampled and compared to expected results on this clock cycle. After the data has been captured, the scan enable signal is asserted again and the captured data 630 is shifted out and tested on the serial data output pin. This process will be repeated several times with different serial scan test patterns.

As previously described, there are two general types of timing parameters to be tested in an IC, the maximum internal data transfer rate and the input/output pin timing. The first, and generally most critical, is the maximum internal data transfer rate. This is the maximum rate in which the IC must be able to propagate signals from the output of one register, through the combinatorial logic, and into the next register stage.

The waveform diagram 700 of Prior Art FIG. 7 shows an example of how this parameter can be tested using scan based patterns. A scan test pattern data is serially loaded into the internal registers with the Scan Enable signal 705 asserted (high) and the clock cycle time set to $t_{scan\ 710}$. The clock edge that shifts the last test pattern state prior to the Scan Enable signal 705 being de-asserted (low) is referred to as the launch edge 715, as it loads the internal state which is going to propagate through the internal combinatorial logic to the inputs of the next register stage, which are latched on the next clock edge, the capture edge 720.

The capture edge 720 is brought forward to set the clock cycle for one cycle to $t_{cycle}$ 725. This will test for delay faults that were sensitized by the last pattern state that was loaded prior to the launch clock edge, that is, a pattern state such that the launch causes a signal transition to occur in the path or node being tested on the launch edge 715.

One of the potential problems that can be encountered in the previous technique is the inability to create a pattern state that can cause a transition on a particular path or node. An example of this type of problem is depicted in Prior Art FIG. 8. A combinatorial logic section having an AND gate 805 between the outputs of registers R8 and R9 and the input to register R14. While a transition in the path between R9 to R14 can be tested, the path from R8 to R14 cannot. This is because the output of R8 must be set to a low state prior to the launch edge, and then switched to a high state by the launch edge. However, the previous low state of R8 will be shifted into R9 on the launch edge, preventing the propagation of the transition out of R8 into R14.

To circumvent this problem, a timing pattern 900 as shown in Prior Art FIG. 9, may be used. In this test, the data for the launch pattern is not shifted in from registers, but loaded through the previous stage of combinatorial logic and/or the external data input pins. The launch edge 905 occurs after the scan enable is deasserted, and after the last shift edge 915.

Prior Art FIG. 10 depicts an example of a data input logic section 1000 of an IC, for which input pin timing may be tested. To test the minimum setup time ($t_{su}$) of input pin B 1001 before the positive clock transition on Register D 1002, Pin A 1003 and Pin C 1004 must be sensitized one clock cycle prior to the capture cycle. Sensitizing a path infers that the signal path to be tested is adequately enabled, which in the case depicted in FIG. 10 requires that the data input A be set to a low state and data input C must be set to a high state in order to allow a transition on Pin B 1001 to propagate to register D 1002. Typically, only one input pin is tested per scan pattern.

Prior Art FIG. 11 depicts a set of example waveforms 1100 used to test the input pins shown in FIG. 10. Four test segments are shown. In test segment 1101, Input A 1110 is low and Input C 1115 is high one clock cycle before a low-to-high transition is introduced at Data Input B 1120, while scan enable is deasserted. The timing pattern of segment 1101 tests $t_{su}$ for input B.

In test segment 1102, Input A and Input B are sensitized as in test segment 1101, but the input edge at Input B has been shifted to provide a test for the hold time ($t_{hd}$) on a high-to-low transition 1130.

In test segment 1103, the setup time ($t_{su}$) for Input C is tested. In this case, the path is sensitized by having at least one of Input A and Input B set high, so that the transition 1135 at input C will propagate through AND Gate B of FIG. 10.

In test segment 1104, the setup time ($t_{su}$) for a high-to-low transition 1150 at Input A is tested. In this case, the path is sensitized by having Input C high 1140, and Input B low 1145.

Prior Art FIG. 12 shows an example of an output pin timing test ($t_{pd}$ and $t_{toh}$, FIG. 3) using scan based testing. Typically, only one output pin is tested per scan pattern. To test the maximum propagation delay ($t_{pd}$) for a specific output pin, the appropriate test pattern required to cause a transition on the output pin under test is shifted into the internal registers. The state of the output pin under test is captured and tested for the expected data state at the specified propagation delay time ($t_{pd}$) after the clock edge 1205.

The structural test waveforms described can generally be created by existing general purpose ATE systems using their per-pin timing features previously shown in Prior Art FIG. 4. However, requirements for testing a high number of different path delays ($t_{cycle}$, Prior Art FIGS. 7 and 9), potentially using a different specification for each path, would require more unique time sets than would be practical using a traditional time set memory design.

SUMMARY OF INVENTION

Accordingly, what is needed is an improved ATE system that provides more efficient generation of waveforms for performing delay testing with scan based testing. More specifically, what is needed is an ATE system that allows the efficient use of memory while allowing for a wide range of timing waveform variations. The embodiments of the present invention provide such advantages. These and other aspects of the present invention not recited above will become clear within the descriptions of the present invention presented below.

In one embodiment of the present invention, a programmable time event and waveform generator is described in a mechanism for generating clock waveform signals that are capable of being reprogrammed from pattern memory in between scan patterns. The time event and waveform generator comprises a programmable delay element that is programmed with values stored in pattern memory. For scan based testing, the time event and waveform generator is programmed between test pattern scan sequences by serial loading data from the test pattern memory. The generator may be used to generate precise signal transitions to input pins of a circuit under test, and to capture at precise times the signal states from the output pins of a circuit under test. The data for programming the delay element may be accessed directly from test pattern memory.

In an embodiment of the present invention, a programmable delay element is combined with a serial in/parallel out shift register and an AND gate to provide a programmable waveform generator. The waveform generator may be programmed by serially accessing data directly from test pattern memory between test data scan sequences. The inputs of multiple waveform generators may be coupled to a single test pattern memory and the outputs coupled to a clock driver to provide a system capable of producing a composite waveform for testing a logic circuit. The system can be reprogrammed from pattern memory in between scan patterns.

In a second embodiment of the present invention, a precision programmable delay element is combined with coarse delay elements, a memory, and logic elements to provide a system having a single programmable time event generator that can be dynamically reallocated and reprogrammed for reuse by different tester pins in order to generate precise signal transitions for application to the input pins of a circuit under test.

In yet another embodiment of the present invention, a precision programmable delay element is combined with coarse delay elements, a memory, and logic elements to provide a system having a single programmable time event generator that can be dynamically reallocated and reprogrammed for reuse by different tester pins in order to capture at precise times the signal states from the output pins of a circuit under test.

BRIEF DESCRIPTION OF THE DRAWINGS

Prior Art

Prior Art

Prior Art

Prior Art

Prior Art

Prior Art

Prior Art

Prior Art

Prior Art

Prior Art

Prior Art

DESCRIPTION OF THE PREFERRED EMBODIMENTS

Reference will now be made in detail to the embodiments of the invention, dynamically reconfigurable precision signal delay test systems for Automatic Test Equipment (ATE), examples of which are illustrated in the accompanying drawings. While the invention will be described in conjunction with the preferred embodiments, it will be understood that they are not intended to limit the invention to these embodiments. The invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to obscure aspects of the present invention unnecessarily.

Figure 7:
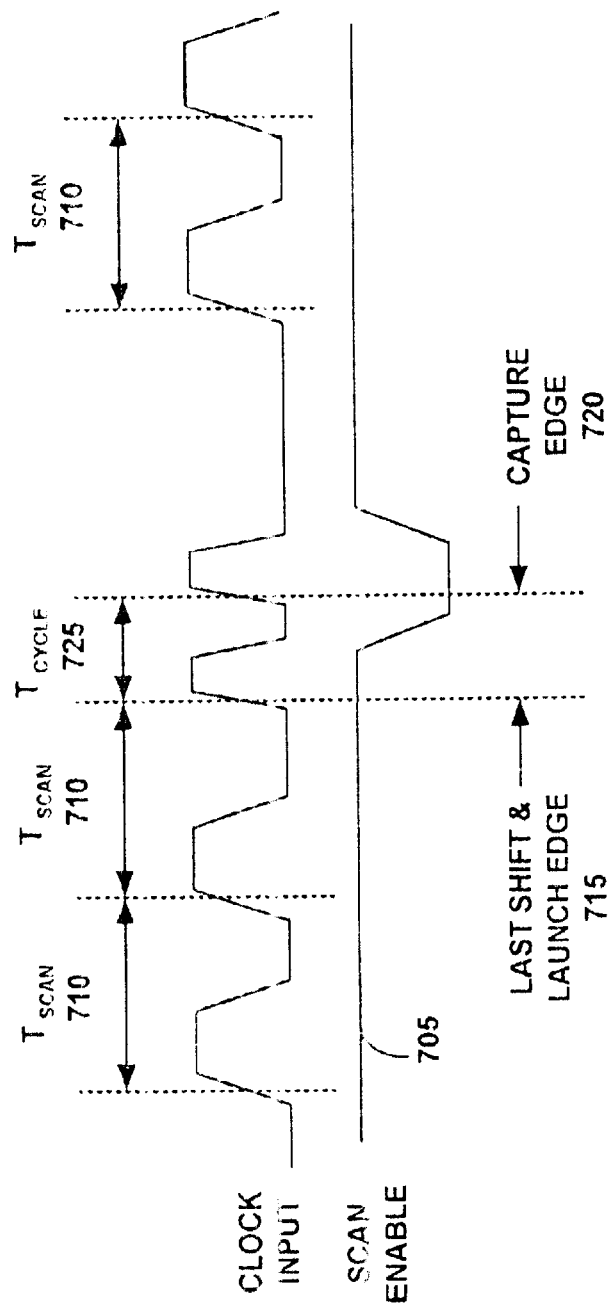
FIG. 7 depicts an example of a timing pattern associated with testing the maximum internal data transfer rate of an IC.
Figure 8:
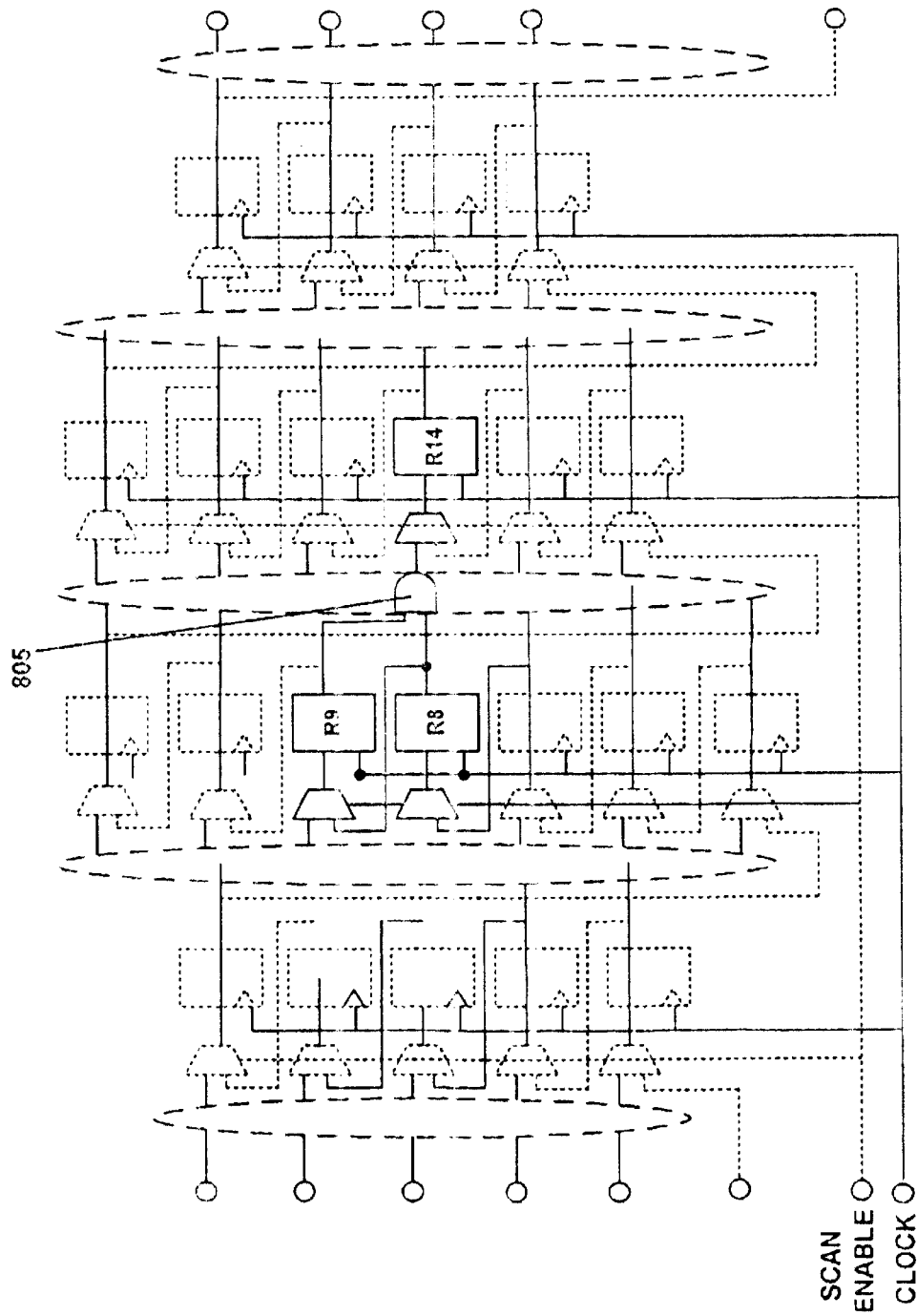
FIG. 8 depicts an example of a circuit for which a shifted in pattern state cannot produce a desired transition.
Figure 9:
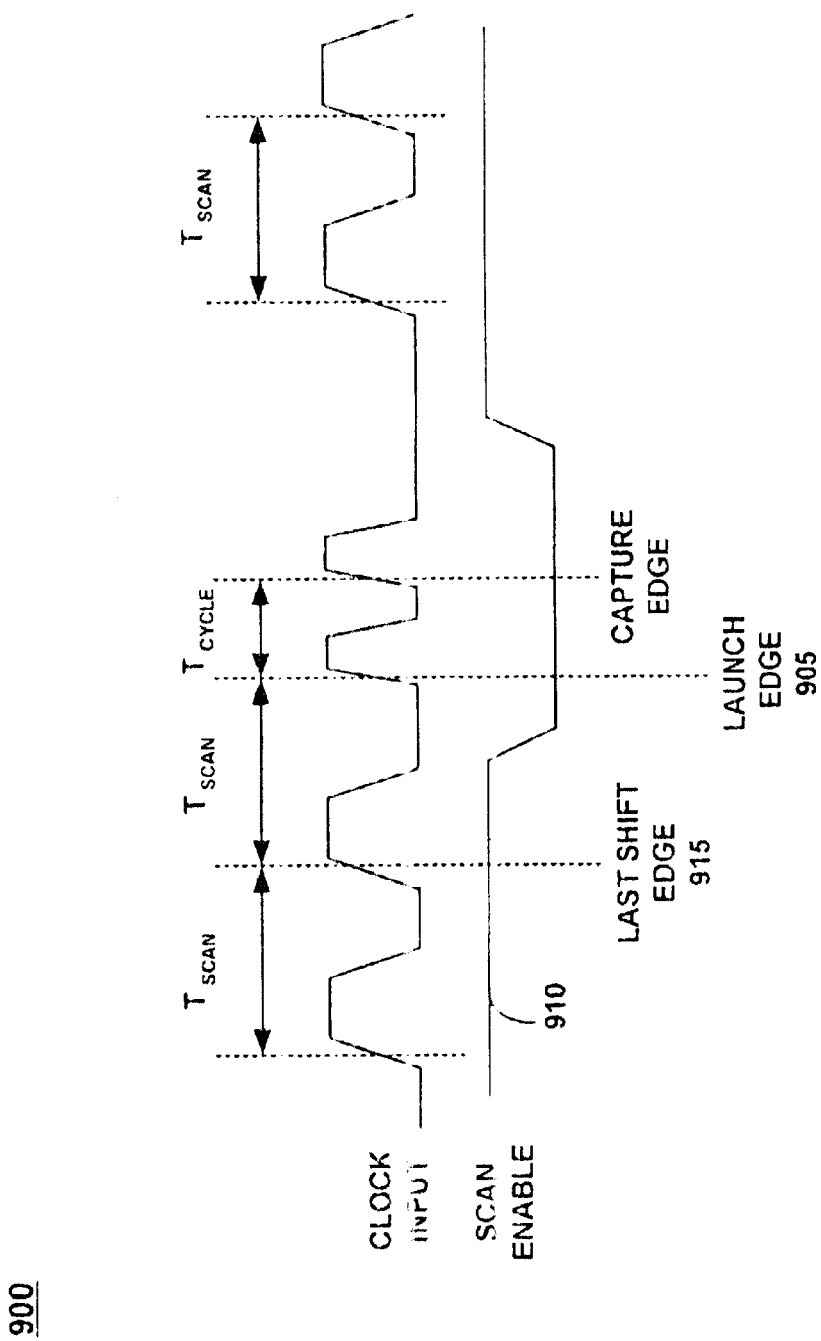
FIG. 9 depicts a timing pattern for use with the circuit of Prior Art FIG. 8.

As previously described, conventional Automatic Test Equipment (ATE) requires a prohibitive amount of time set memory for testing a high number of different path delays ($t_{cycle}$, Prior Art FIGS. 7 and 9). In an embodiment of the present invention, the timing values are stored in the larger pattern memory instead of time set memory. Since clock waveform changes are typically only required at intervals between scan pattern sequences, clock timing can be modified directly from the pattern memory using a serial sequence of data.

Figure 13:
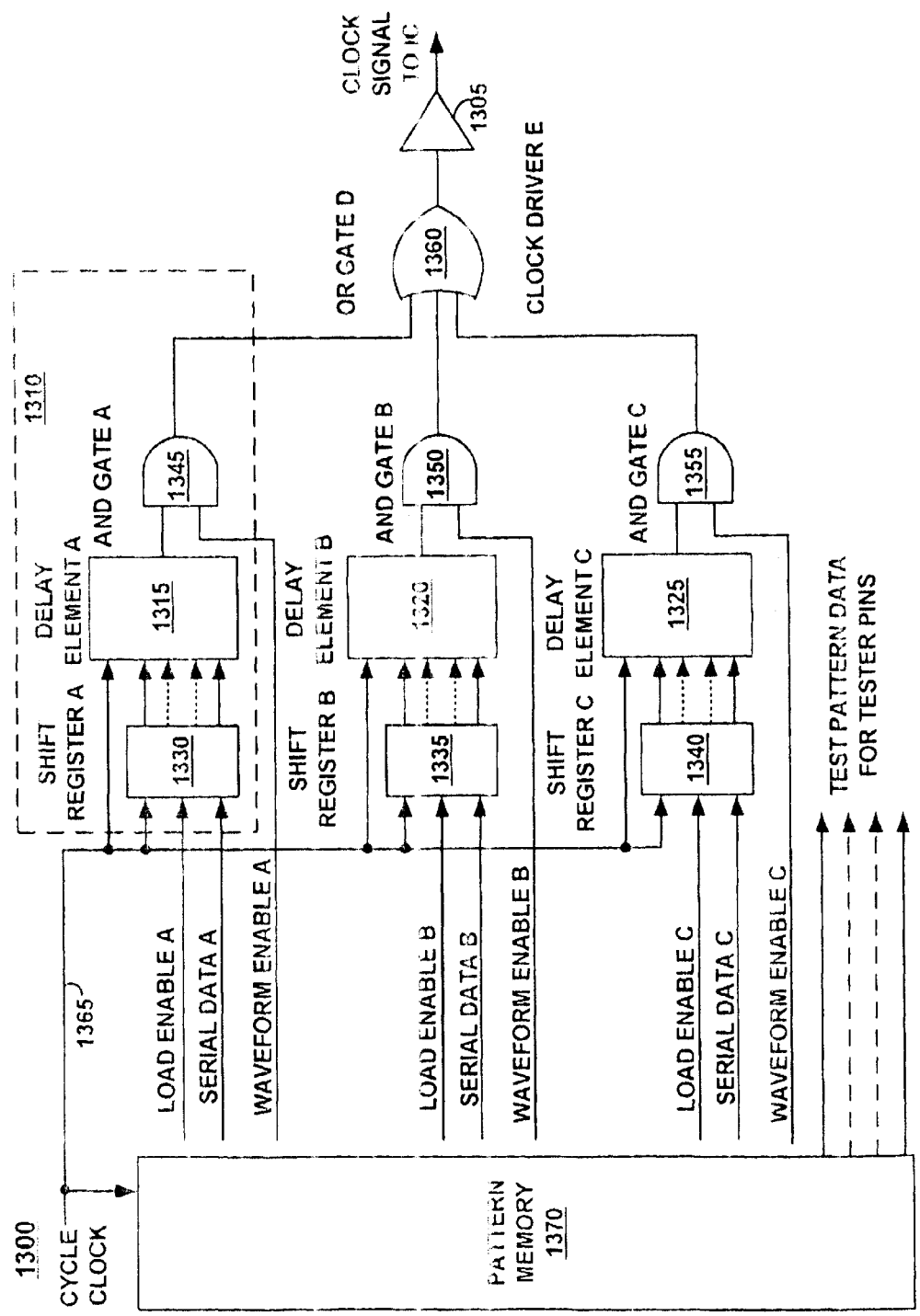
FIG. 13 shows a single clock driver coupled to multiple waveform generators in accordance with an embodiment of the present claimed invention.

FIG. 13 depicts a diagram of a circuit 1300 that may be used for generating clock waveform signals that are capable of being reprogrammed from pattern memory in between scan patterns. Circuit 1300 includes a single clock driver E 1305 which can be stimulated by multiple, e.g., three, individually programmable clock waveform generator circuits (other implementations could have more or less waveform generators). Each waveform generator 1310 comprises a programmable delay element (e.g., delay element A 1315, delay element B 1320, and delay element C 1325), which delays both the rising and falling edges of the clock input waveform, a serial in/parallel out shift register (e.g., shift register A 1330, shift register B 1335, and shift register C 1340) of which the parallel output contains the rising and falling delay values for the delay element, an AND gate (e.g., AND gate A 1345, AND gate B 1350, and AND gate C 1345) which enables the output of the delay element. For waveform generator 1310, shift register A 1330 is serially loaded with serial data A from the pattern memory 1370 when its associated load enable A signal is asserted. The outputs of the three waveform generators are combined using OR gate D 1360 and delivered to the circuit under test using clock driver E 1305.

The pattern memory 1370 stores a plurality of data which is used to define data states to be delivered to an electronic circuit under test. The pattern memory 1370 may also store all or part of data that contains the values for specifying the relative timing positions for the signal waveform generators, and control data for enabling said waveform generators.

Figure 14:
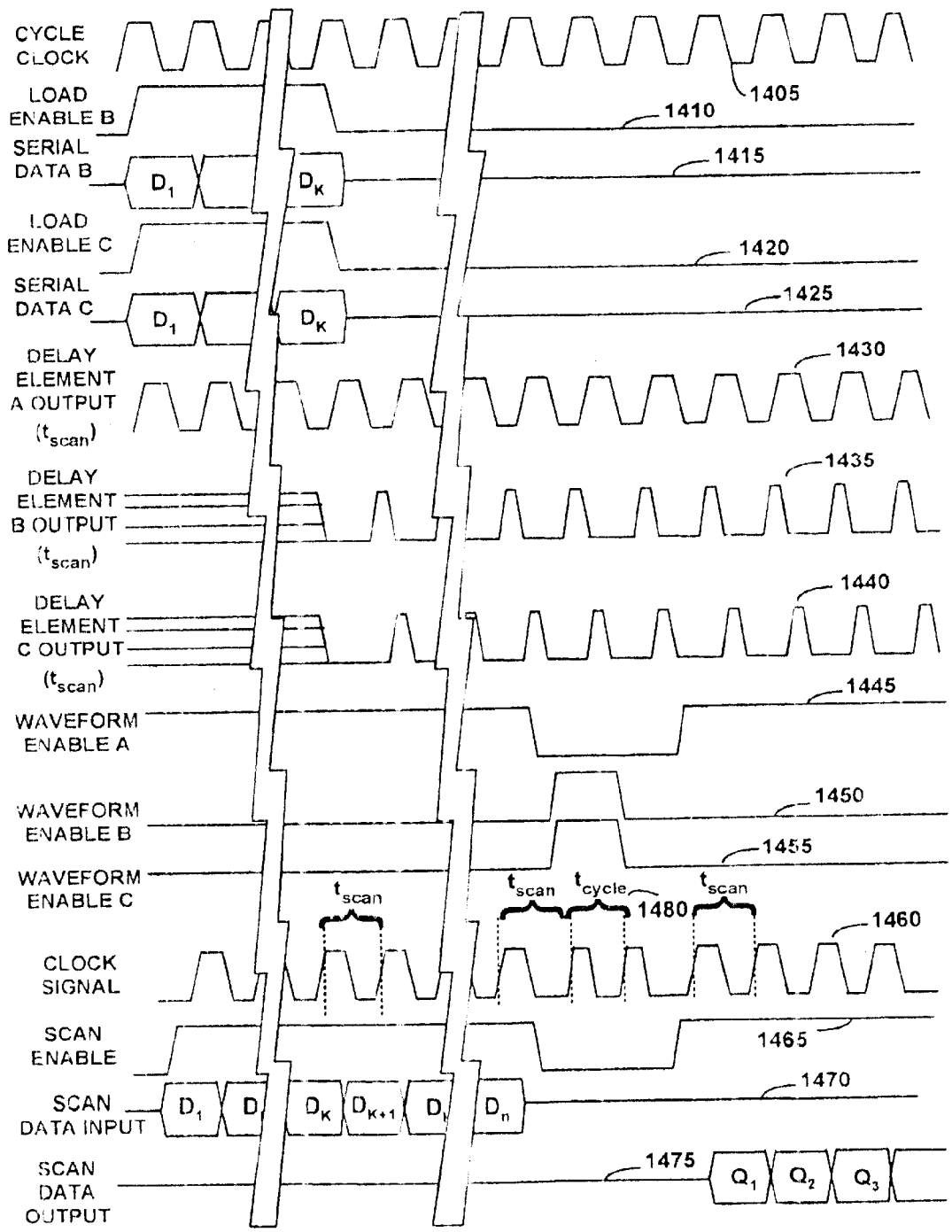
FIG. 14 depicts the waveforms of the circuit shown in FIG. 13 used to generate the IC clock waveforms shown in Prior Art FIG. 9.

FIG. 14 depicts the waveforms of the circuit shown in FIG. 13 used to generate the IC clock waveforms shown in Prior Art FIG. 9. In this example, delay element A 1315 of FIG. 13 has previously been programmed to generate the waveform to create the scan clock waveform ($t_{scan}$) (this value typically does not change during a test). The number of bits required to load shift register B 1335 & shift register C 1340 is k bits as shown by serial data B 1415 and serial data C 1425. The length of the scan chain is n bits, and n is larger than k.

Referring again to FIG. 14, while a scan pattern is being loaded, scan enable 1465 is high, waveform enable A 1445 is also high, causing the IC clock signal 1460 to be derived from the cycle clock 1365 (waveform 1405) through delay element A 1315 and AND gate A 1345.

The timing for the next $t_{cycle}$ value is setup concurrent with the scan pattern load 1470 by setting load enable B 1410 and load enable C 1420 high, and loading shift register B 1335 and shift register C 1340 with serial data B 1415 and serial data C 1425 respectively.

At the end of the scan pattern load 1470, scan enable 1465 is switched low, as is waveform enable A 1445. Waveform enable B 1450 and waveform enable c 1455 are switched high, causing the input of clock driver E 1305 to be derived from delay element B 1320 (waveform 1435) and delay element C 1325 (waveform 1440) providing the output clock signal 1460 with a cycle with a period of $t_{cycle}$ 1480. This example uses the two cycle capture timing, as described in Prior Art FIG. 9. The resultant-launch-capture timing is the difference in the delays written into delay element B 1320 and delay element C 1325.

After the application of $t_{cycle}$ as described above, the scan enable signal 1465 goes high, and the normal scan timing using delay element A is re-established. The scan pattern 1475 is read out. The above steps may be repeated for the next scan pattern, in which new values can be loaded for $t_{cycle}$.

Figure 10:
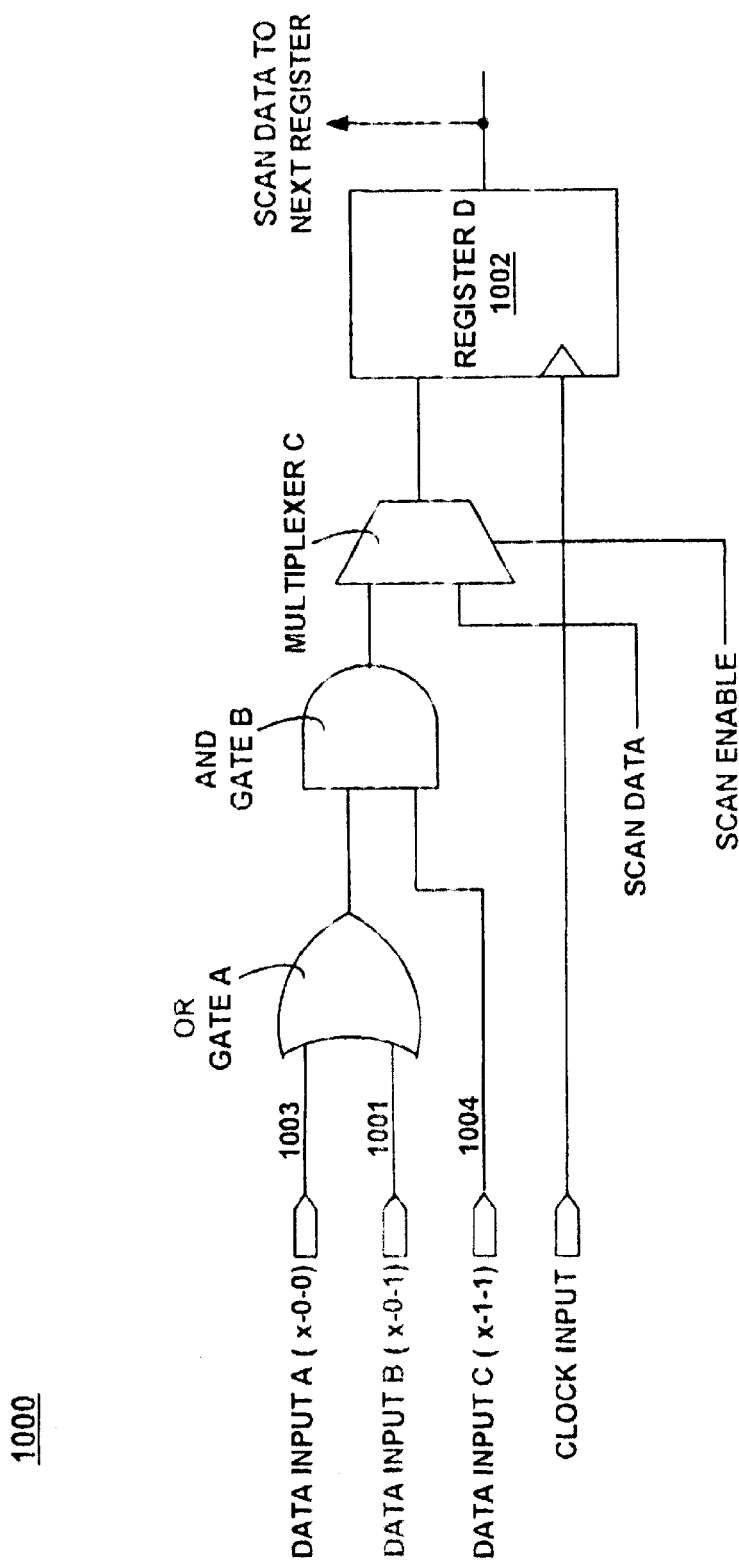
FIG. 10 depicts an example of a data input logic section of an IC under test.
Figure 11:
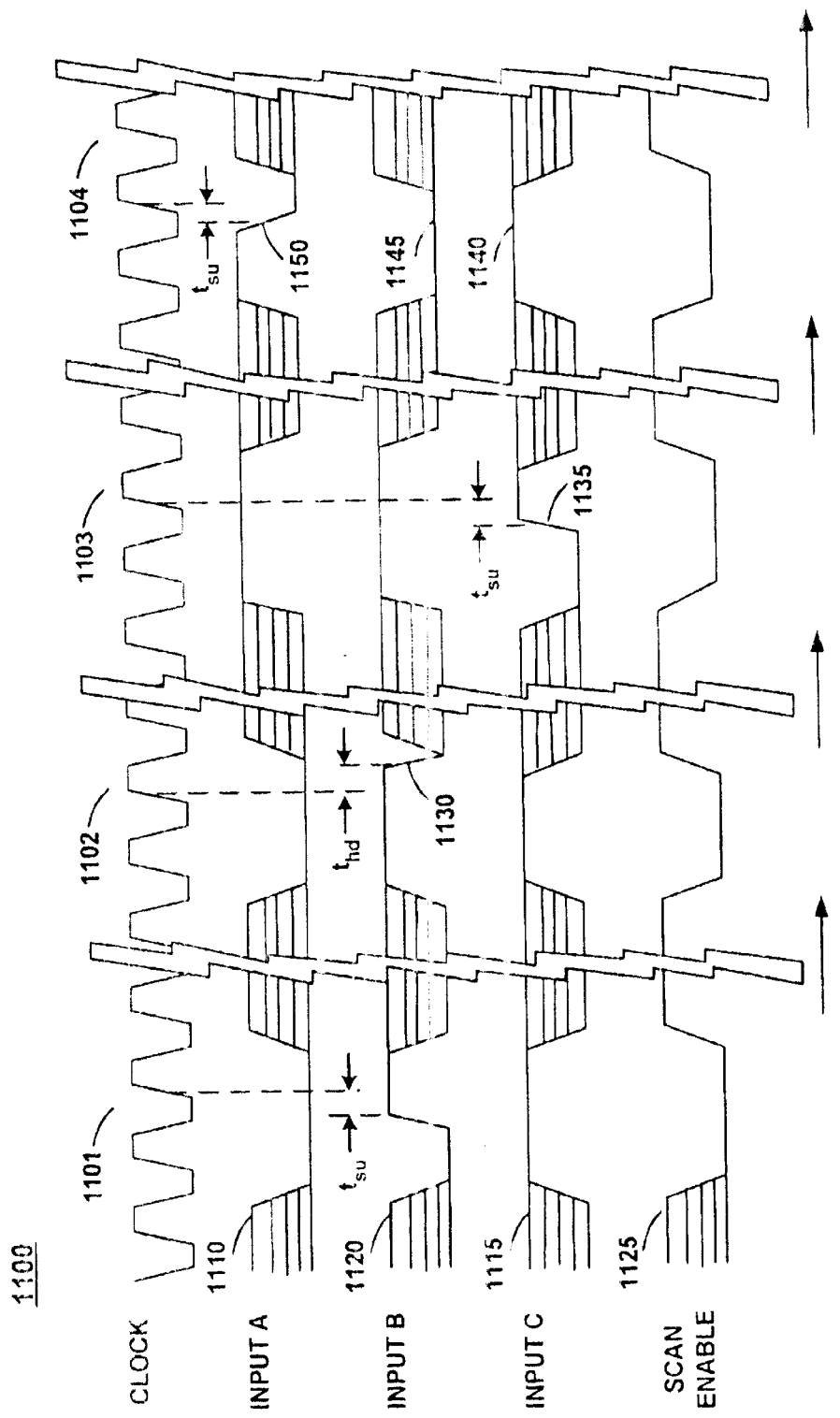
FIG. 11 depicts a set of example waveforms used to test the input pins depicted in Prior Art FIG. 10.

In testing the signal path delays between input pins and the first internally clocked register as previously described in Prior Art FIGS. 10 and 11, traditional IC testers utilize independent timing circuits on each pin to generate timing waveforms.

Figure 15:
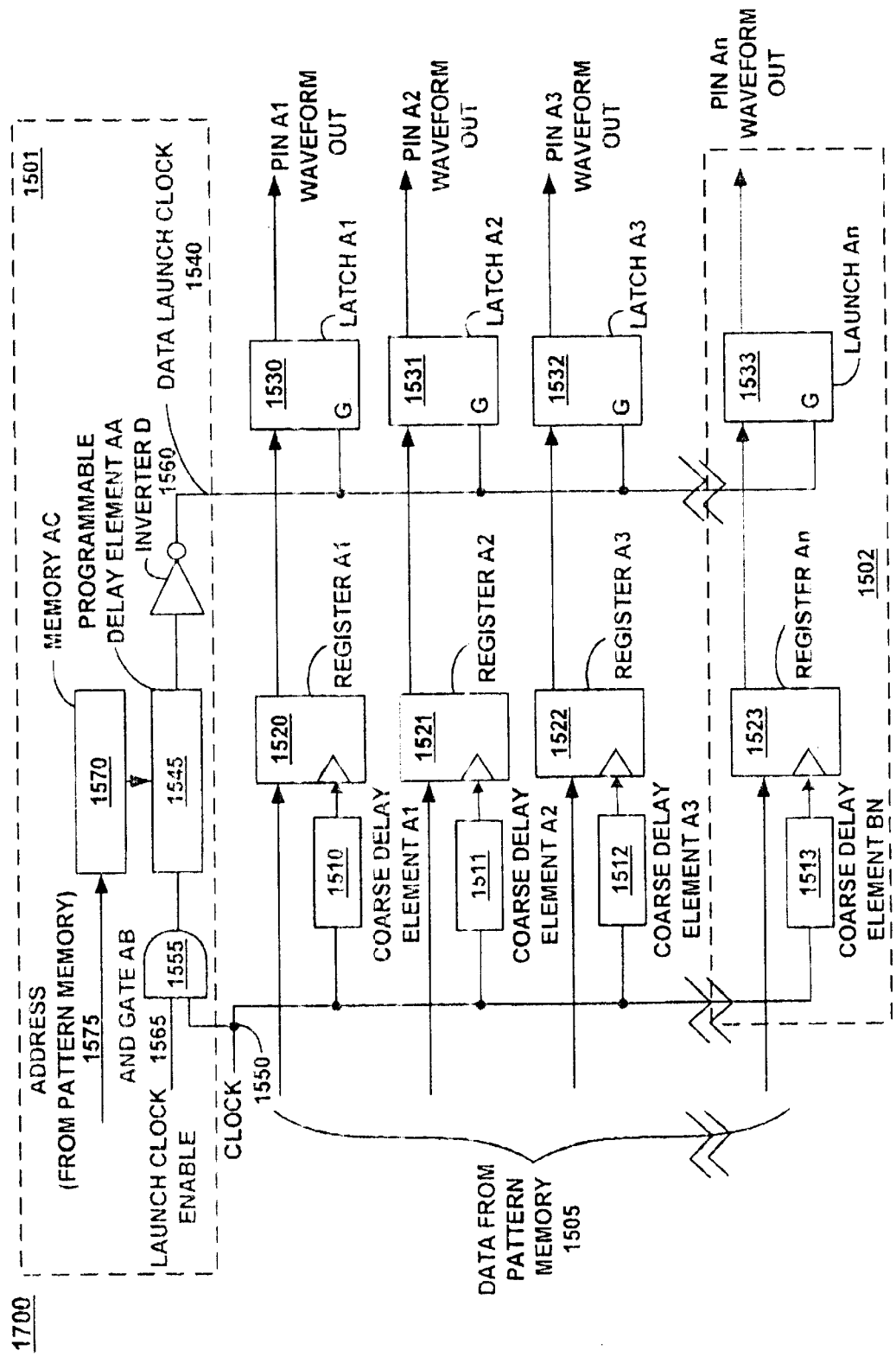
FIG. 15 depicts a single precision timing circuit that services a set of data pins in testing the signal path delays between input pins and the first internally clocked register of an IC in accordance with an embodiment of the present claimed invention.

FIG. 15 shows a schematic diagram 1500 of a precision timing circuit that services a set of data pins (Pin A1 . . . Pin An) in testing the signal path delays between input pins and the first internally clocked registers of an IC. This embodiment 1500 is directed to a mechanism for utilizing a single programmable time event generator that can be dynamically reallocated and reprogrammed for re-use by different tester pins in order to generate precisely placed signal transitions when applying signals to the input pins of a circuit under test.

The timing circuit 1500 includes a single programmable time event generator 1501, that comprises a memory AC 1570, a programmable delay element AA 1545, and AND gate AB 1555, and an inverter D 1560. The programmable delay element AA 1545 is a precision delay element that may be programmed for each data test pattern.

The programmable time event generator 1501 generates a precisely controlled timing signal, where the position of the timing signal can be dynamically changed relative to a master timing signal based on values accessed from the memory AC 1570.

As shown in FIG. 15, the output for each pin An is derived from a coarse output circuit 1502. These output pins (A1–An) are the pins of the tester device and are applied to the pins of the device under test. The coarse output circuit 1502 comprises a coarse delay element An 1513, a register An 1523, and a latch An 1533. The clock input of latch An 1533 is coupled to the Inverter D 1560 of the single programmable time event generator 1501. The input of the coarse delay element An 1513 is coupled to the clock input of AND gate AB 1555. The output of coarse delay element An 1513 is coupled to the clock input of register An 1523. The data input of register An 1523 is coupled to a pattern memory (not shown), and the data output of register An 1523 is coupled to the data input of latch An 1533.

The signal from the programmable time event generator 1501 causes a data transition on a subset of tester pins (e.g. pins A1–An), which may be comprised of from one to the entire plurality of tester pins.

As shown in FIG. 15, data from pattern memory 1505 are clocked into data register A1 1520, data register A2 1521, data register A3 1522, through data register An 1523, using clock signals that have been delayed through coarse delay element A1 1510, coarse delay element A2 1511, coarse delay element A3 1512, through coarse delay element An 1513.

The per-pin coarse delay elements generate coarse data transition placement prior to the more precise transition placement generated by programmable delay element AA 1545. The coarse delay elements may be programmed during test setup, and usually keep their values for the duration of an IC test, that is, they are not programmable during the test.

The output signals from the registers 1520 through 1523 are connected to the inputs of the per-pin launch latches Latch A1 1530, Latch A2 1531, Latch A3 1532, through Latch An 1533. The behavior of each latch is such that while the Data launch Clock signal is high, any data state change at the input of the latch will cause the same data state change at the output of the latch. Conversely, while the Data Launch Clock 1540 signal is low, the output of the latch maintains the data state that existed when the Data launch Clock went low, regardless of any subsequent changes to the data state at the latch input.

The Data launch Clock signal 1540 is generated by delaying the Clock signal 1550 through programmable delay element AA 1545 whenever Data launch enable 1565 is high (using AND Gate AB 1555). Inverter D 1560 inverts the delayed clock before it is applied to the clock input of the launch latches 1530 through 1533. Programmable delay element AA 1545 has independent delay properties for positive and negative state transitions.

The amount of delay generated by programmable delay element AA is determined by the values accessed from Memory AC 1570, which is addressed from a data field out of pattern memory 1575. The values for memory AC are loaded from a control device (e.g. the tester computer) prior to the execution of any pattern data 1505. The values stored in Memory AC 1570 specify the precise relative time position of a time event with respect to the master clock signal 1750.

Figure 1:
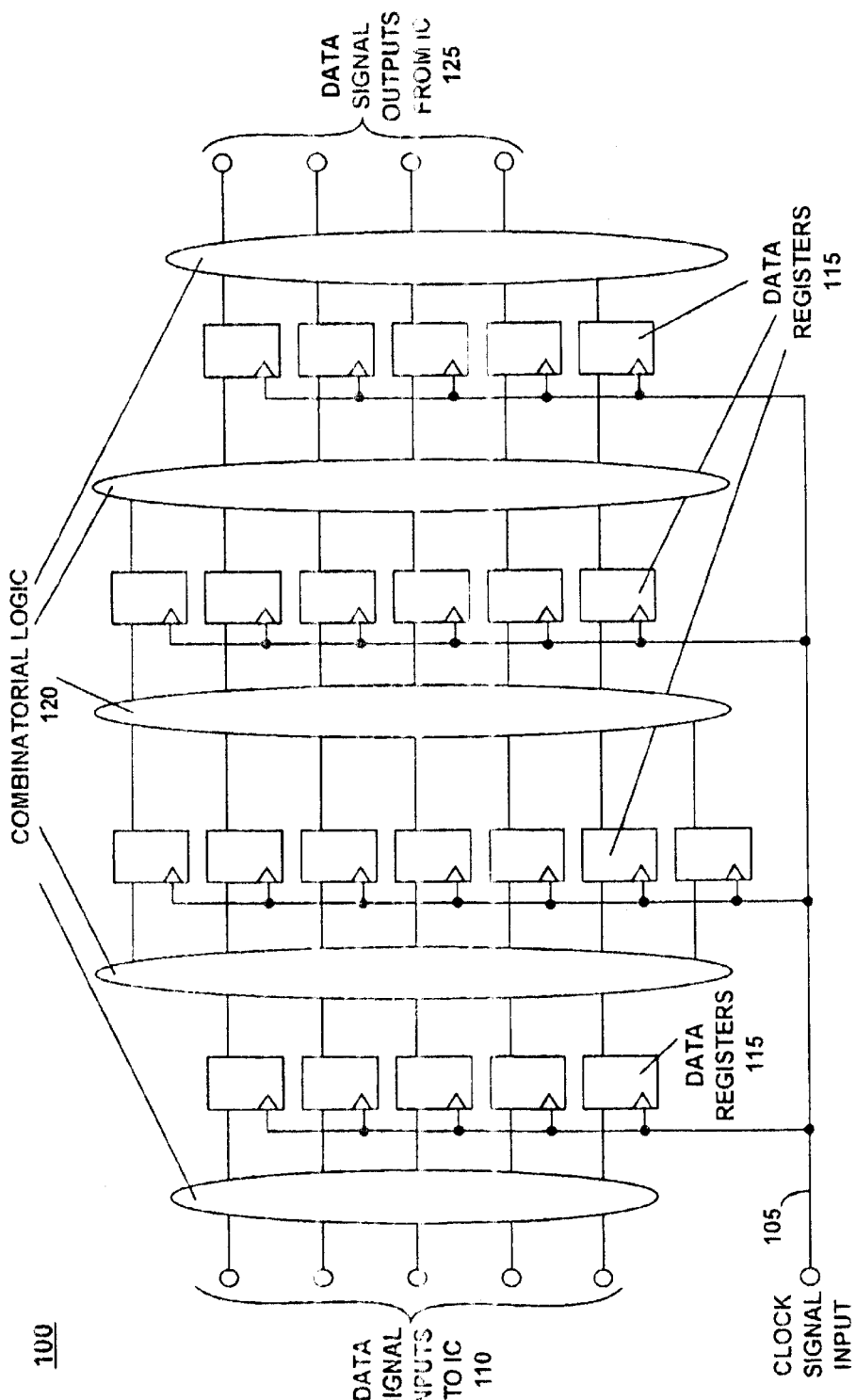
FIG. 1 depicts a diagram of a simplified synchronous digital integrated circuit (IC).
Figure 2:
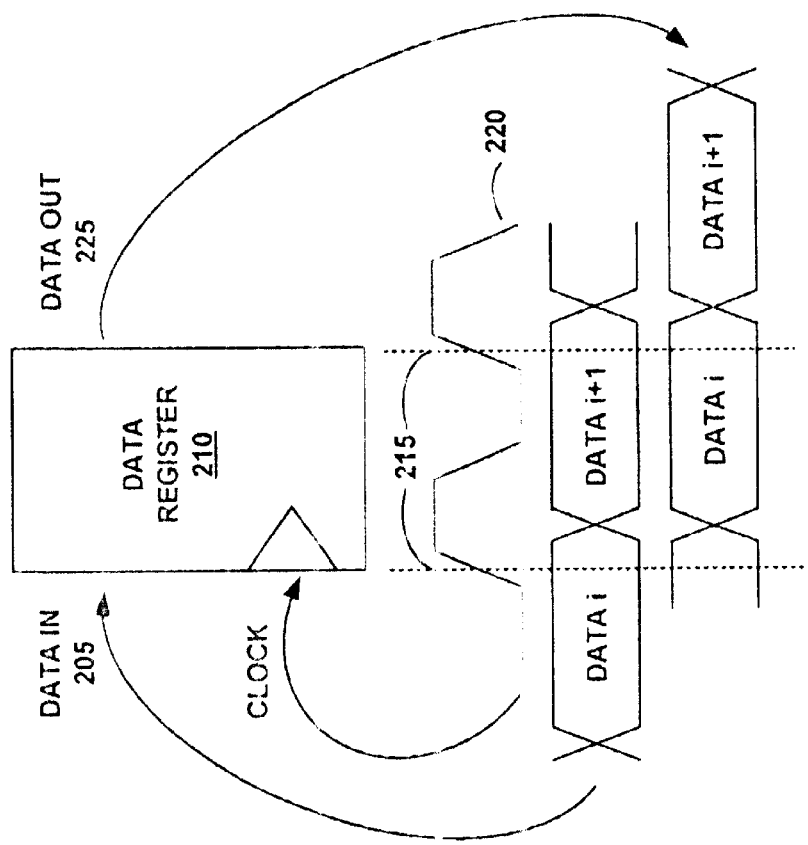
FIG. 2 depicts the operation of the data registers of the IC of Prior Art FIG. 1.
Figure 3:
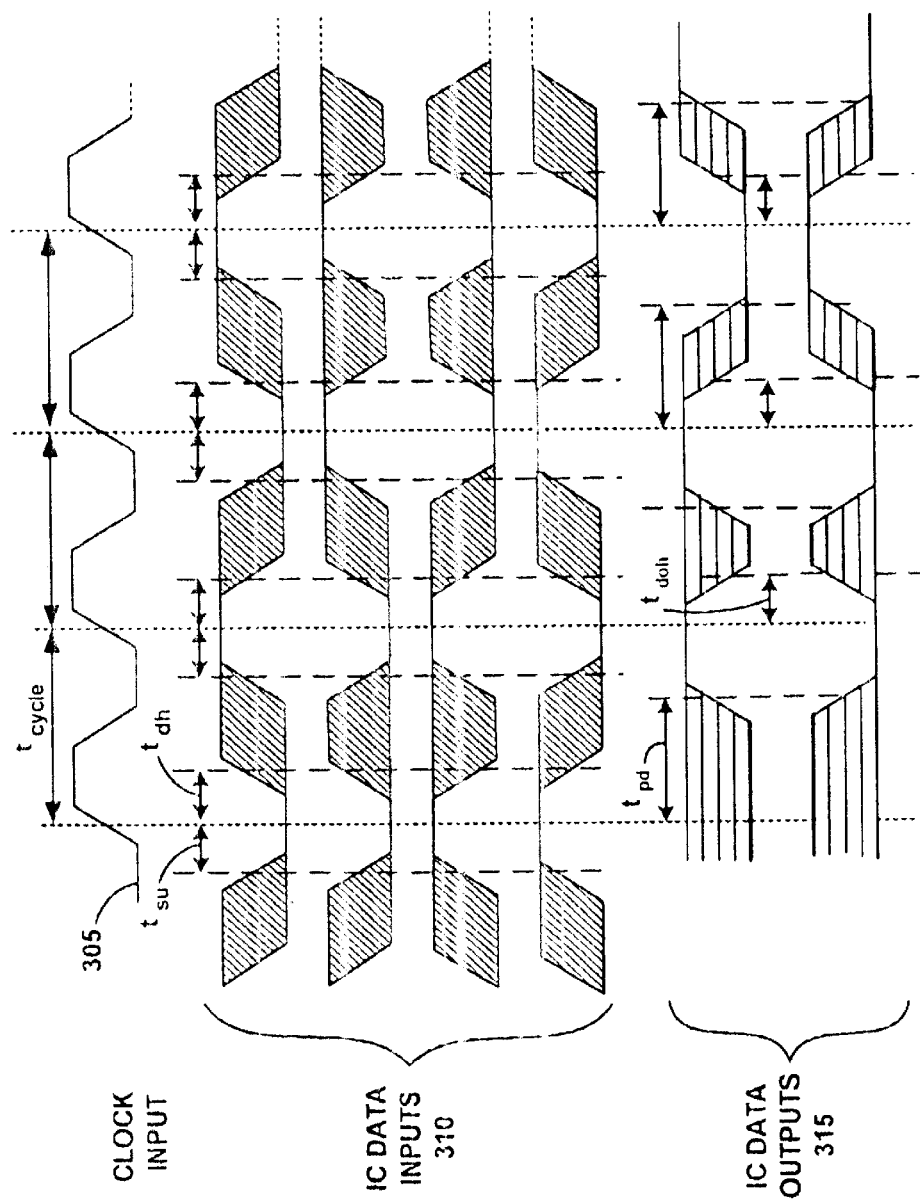
FIG. 3 depicts examples of the critical timing parameters tested on a typical digital IC.
Figure 4:
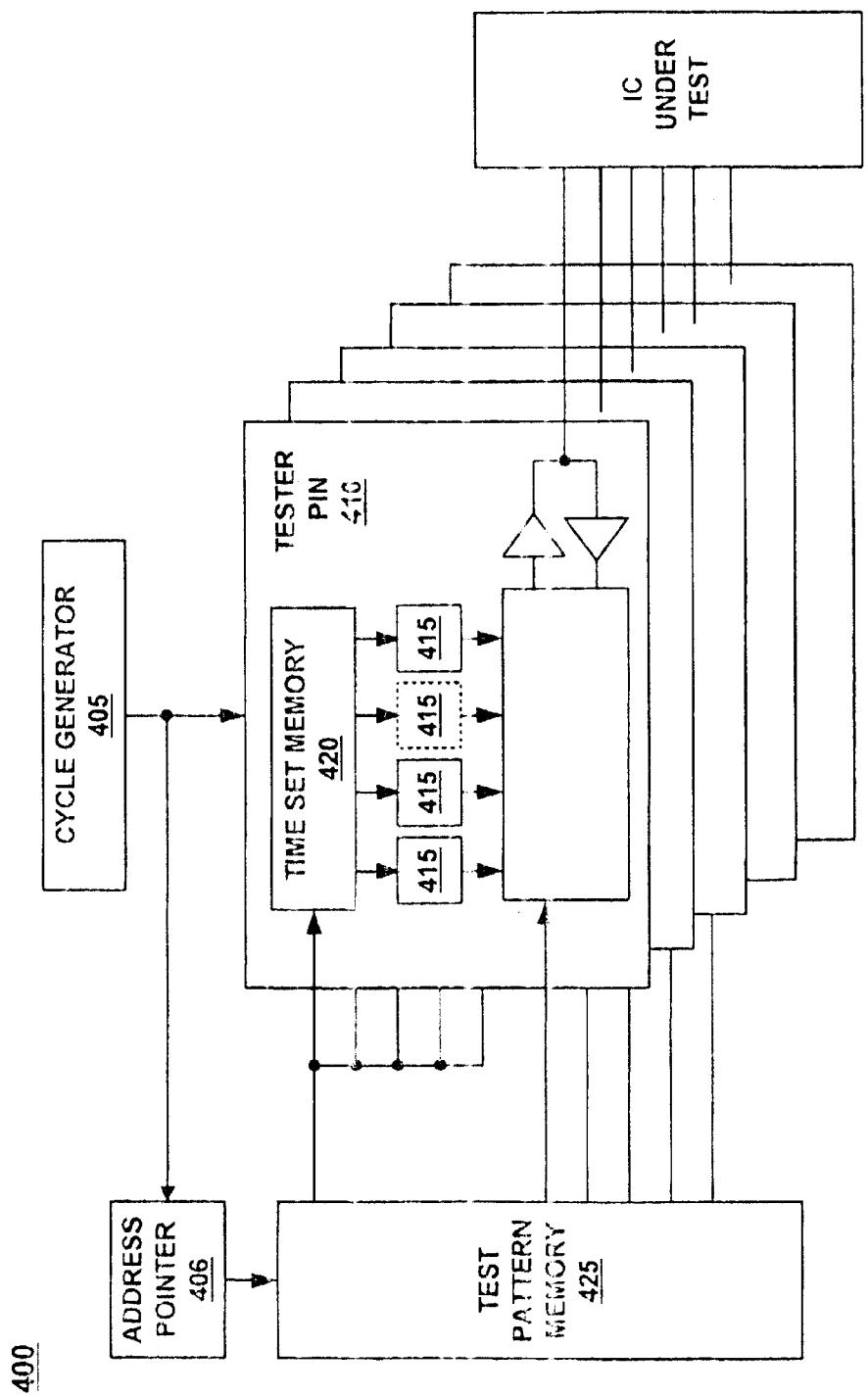
FIG. 4 depicts a diagram of a typical test system used to perform functional testing.
Figure 5:
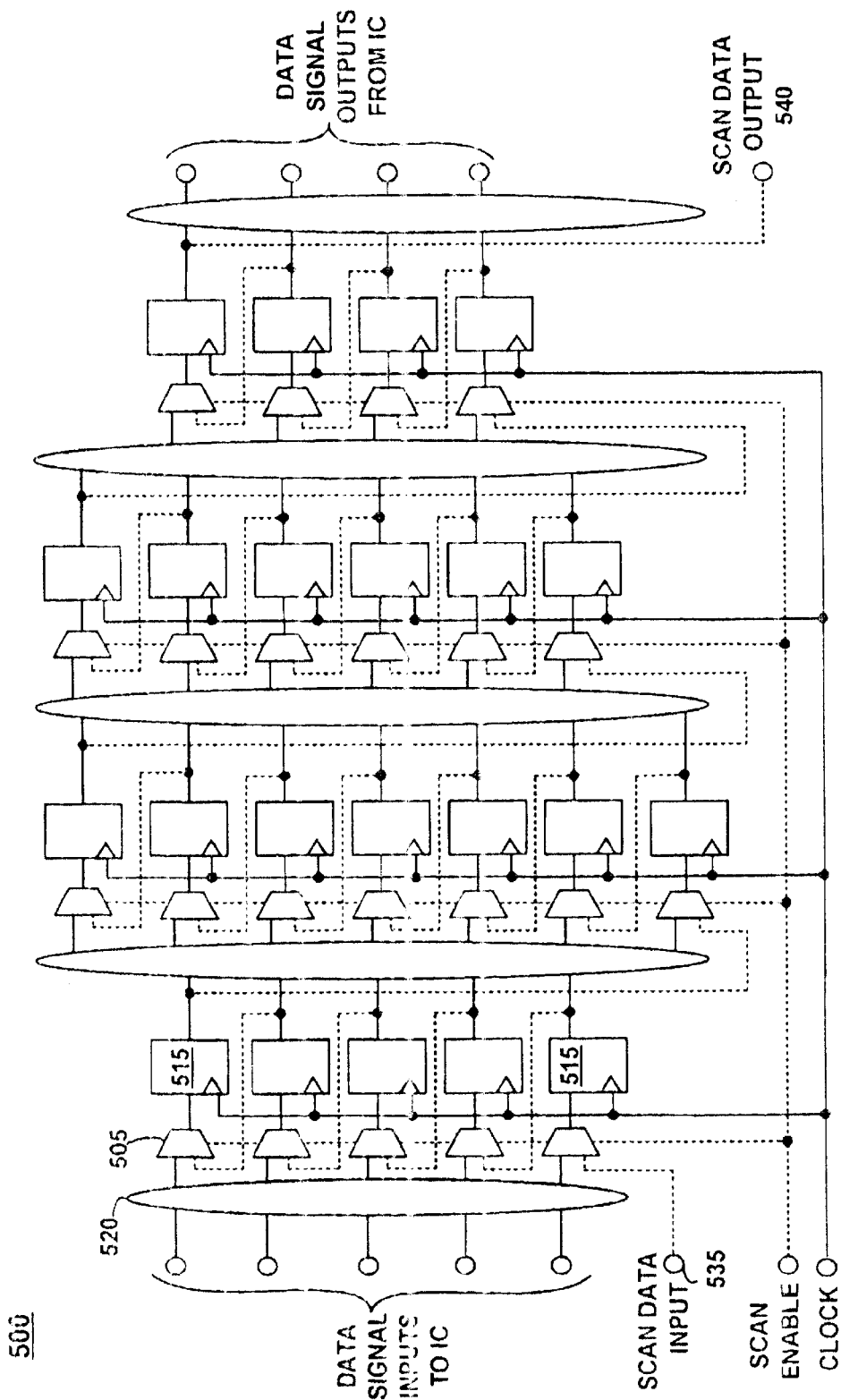
FIG. 5 depicts the IC of Prior Art FIG. 1 with internal scan capability added.
Figure 6:
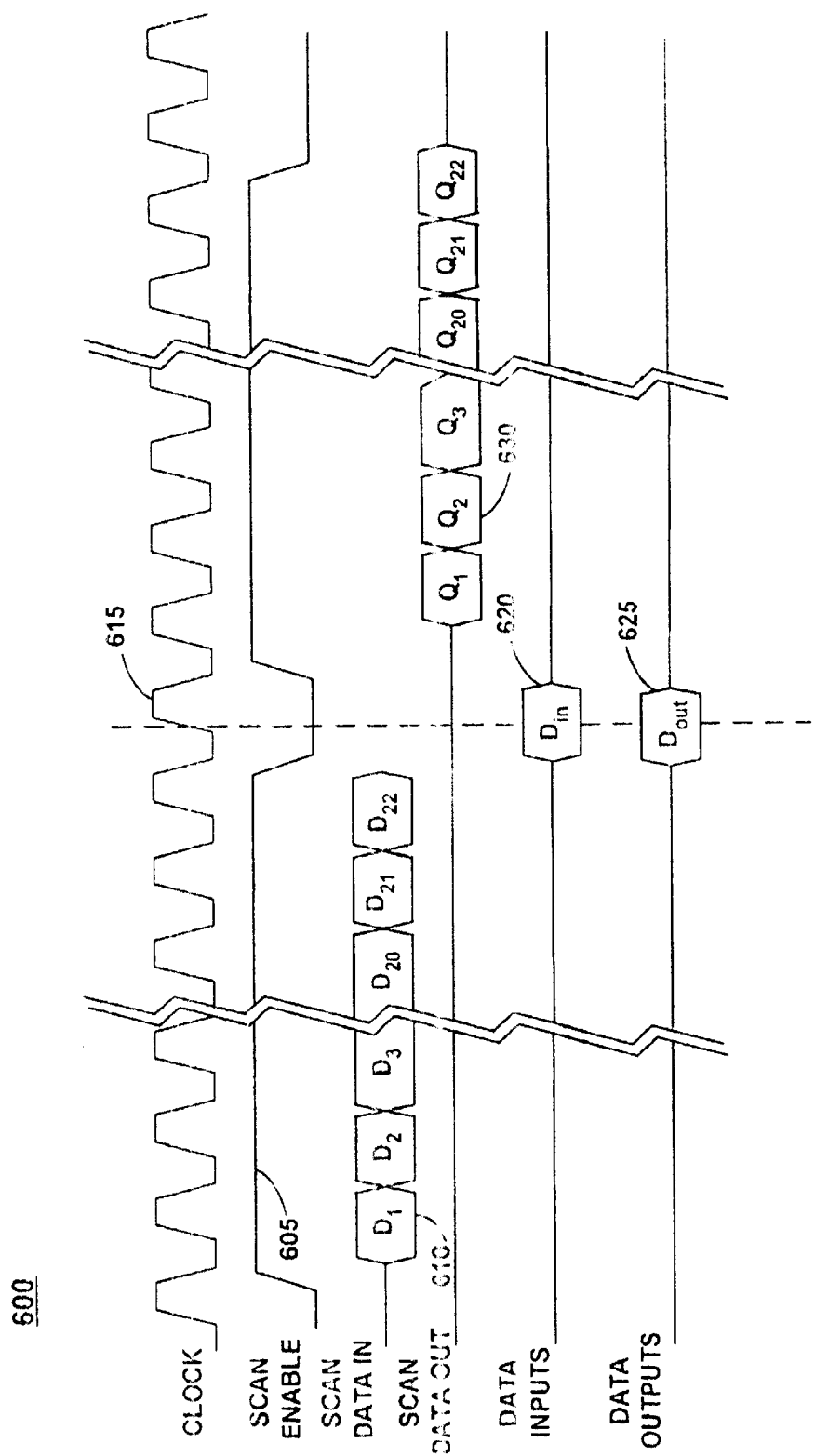
FIG. 6 depicts typical waveforms applied when using the scan pins to test an IC Prior Art

Memory AC 1570 is of sufficient depth to store four (4) delay values for each pin within the served pin segment. For example, if the served pin segment (Pin A1 . . . Pin An) has 64 pins, then memory AC must be of sufficient depth to store 256 (64×4) delay values. The four delay values stored for each pin are 1) the setup time ($t_{su}$, Prior Art FIGS. 3 and 11) for a low to high data transition, 2) the data setup time for a high to low data transition, 3) the data hold time ($t_{hd}$, Prior Art FIGS. 3 and 11) for a low to high data transition, and 4) the data hold time for a high to low data transition. During pattern execution the pattern memory will select the appropriate memory location for the pin and the transition to be tested.

Figure 16:
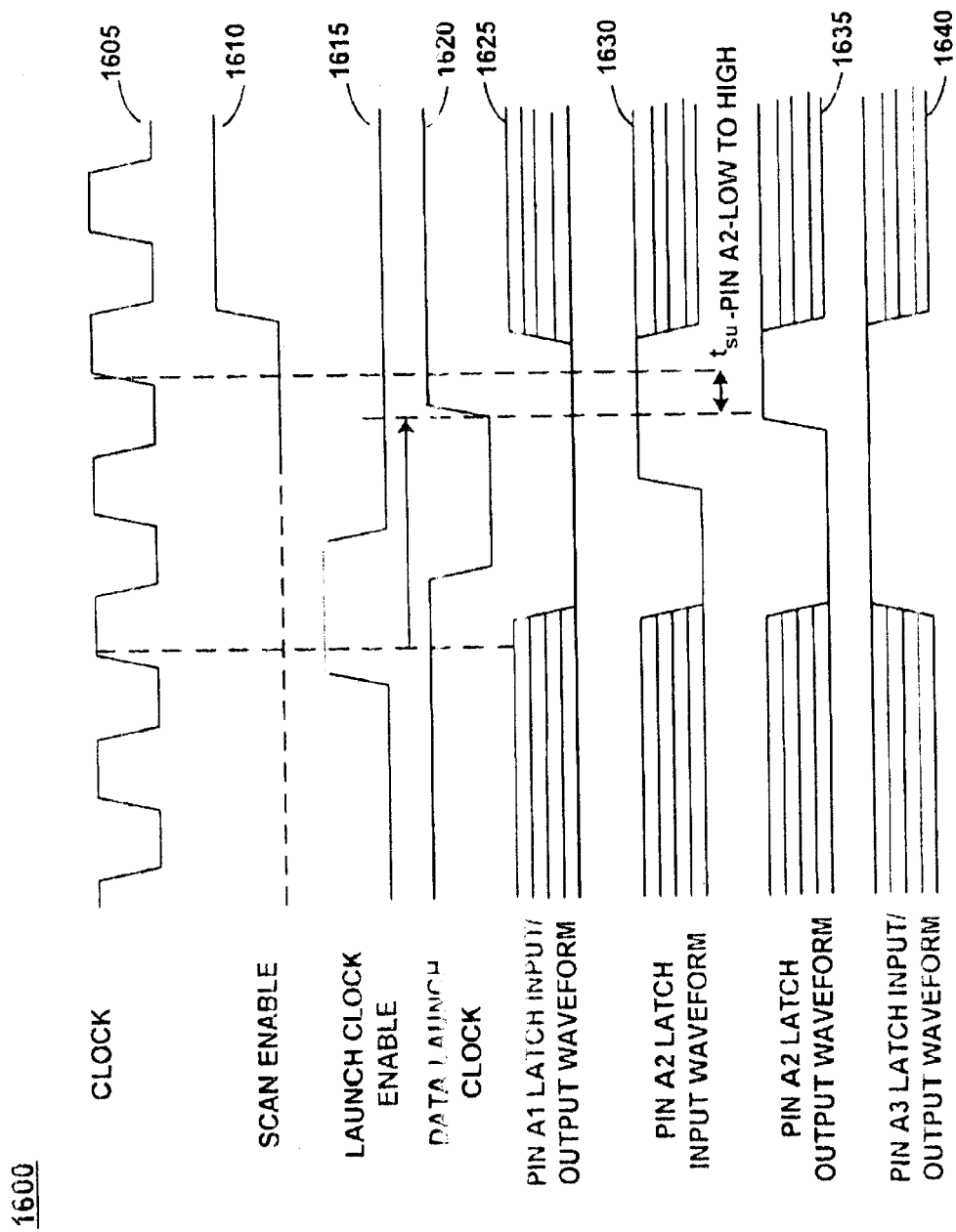
FIG. 16 depicts an example set of waveforms that may be generated in accordance with an embodiment of the present claimed invention.

FIG. 16 depicts an example set of waveforms 1600 associated with a clock 1605 that may be generated in accordance with an embodiment of the present invention to test the setup time ($t_{su}$) previously described in Prior Art FIGS. 10 and 11. Normally, the Data Launch Clock 1620 is in a high state, which allows data to transit through Latches 1530 through 1533 with no delay. However, during a test pattern where an input path delay test is to be performed on a specific pin or subset of pins (e.g., pin A2 of FIG. 16), the Launch Clock Enable Signal 1615 from pattern memory enables the Data Launch Clock 1620 to go low, which inhibits the transition of data for pin A2 until the positive transition of Data Launch Clock 1620.

In testing the signal path delays between the outputs of the last internally clocked registers of the circuit under test and the IC data output pins (as previously described in Prior Art FIG. 12), traditional IC testers utilize independent precision timing circuits on each pin for testing. In contrast, the present invention utilizes a single precision timing circuit to drive multiple pins through a set of capture circuits. The set of pins that are driven may vary, but they are driven by a single precision time event generator.

Figure 17:
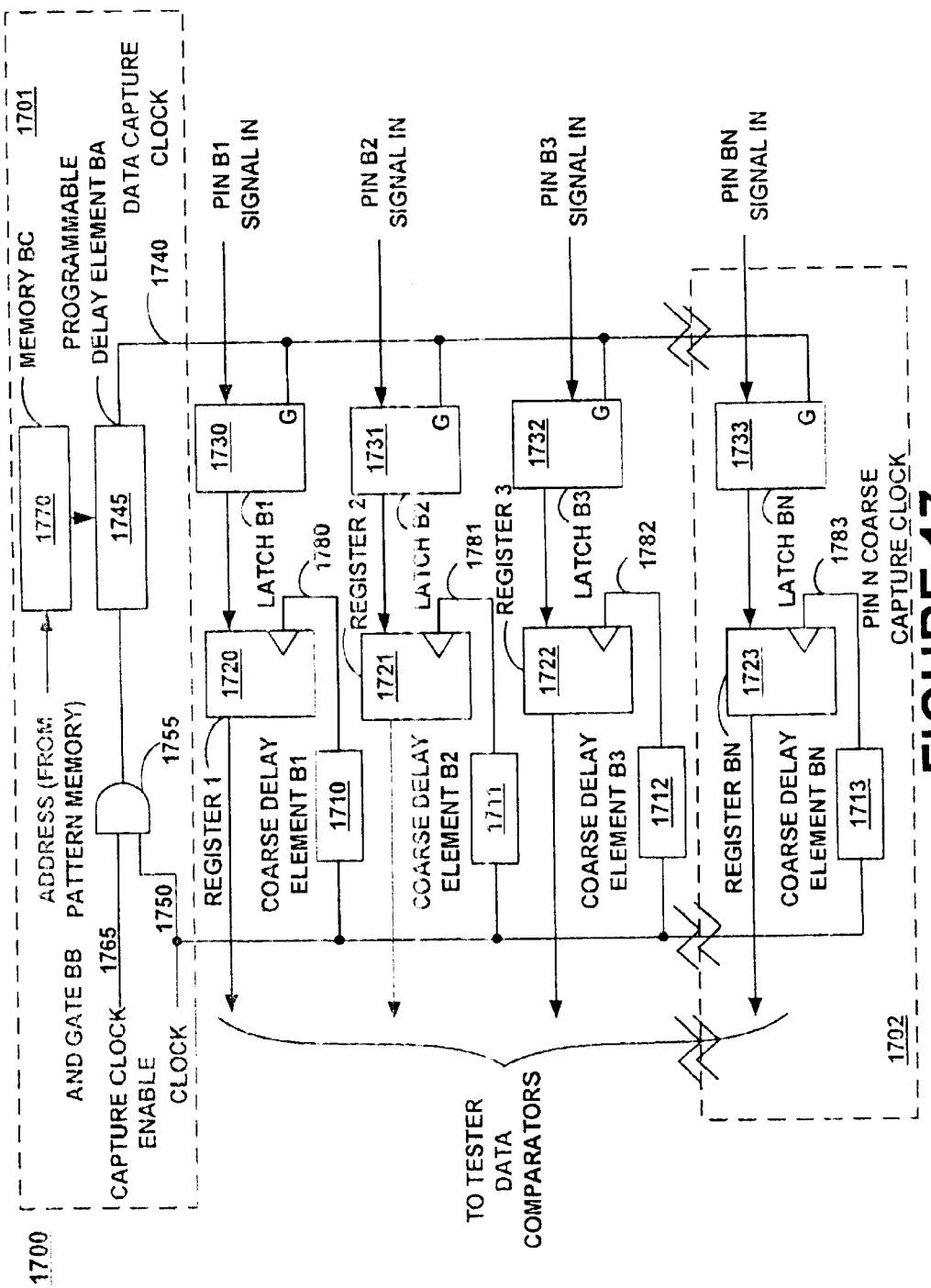
FIG. 17 depicts a single precision timing circuit that services a set of data pins in testing the signal path delays between the last internally clocked registers of an IC and the output pins in accordance with an embodiment of the present claimed invention.

FIG. 17 shows a schematic diagram 1700 of a precision timing circuit that services a set of data pins (Pin B1. Pin Bn) in testing the signal path delays between the last internally clocked registers of an IC and the output pins. This circuit 1700 may be used for utilizing a single programmable time event generator that can be dynamically reallocated and reprogrammed for re-use by different tester pins in order to capture at precise times the signal states from the output pins of a circuit under test.

The timing circuit includes a single programmable time event generator 1701, that comprises a memory BC 1770, a programmable delay element BA 1545, and an AND gate BB 1755. The programmable delay element BA 1745 is a precision delay element that may be programmed for each data test pattern. The programmable time event generator 1701 is similar to the programmable time event generator 1501 of FIG. 15, with the exception of the inverter.

As shown in FIG. 17, the input for each pin Bn is derived from a coarse capture circuit 1702. The coarse capture circuit 1502 comprises a coarse delay element Bn 1713, a register Bn 1723, and a latch Bn 1733. The clock input of latch Bn 1733 is coupled to the programmable delay element BA 1745 of the single programmable time event generator 1701. The input of the coarse delay element Bn 1713 is coupled to the clock input of AND gate BB 1755. The output of coarse delay element Bn 1713 is coupled to the clock input of register Bn 1723. The data output of register Bn 1523 is coupled to tester data comparators (not shown), and the data input of register Bn 1723 is coupled to the data output of latch Bn 1733.

As shown in FIG. 17, each signal from the output pins of the IC under test, pin B1 signal in, pin B2 signal in, pin B3 signal in, through pin Bn signal in, is connected to the input of latches Latch B1 1730, Latch B2 1731, Latch B3 1732, through Latch Bn 1733, respectively.

The behavior of each latch is such that while the Data Capture Clock signal 1740 is high, any data state change at the input of the latch will cause the same data state change at the output of the latch. Conversely, while the Data Capture Clock signal 1740 is low, the output of the latch maintains the data state that existed when the Data Capture Clock 1740 went low, regardless of any subsequent changes to the data state at the latch input.

Normally the Date Capture Clock 1740 is in a high state, which allows data to transit through Latch B1 1730, Latch B2 1731, Latch B3 1732, through Latch Bn 1733, with no delay to the inputs of register B1 1720, register B2 1721, register B3 1722, through register Bn 1723, respectively.

Data is latched into Registers 1720 through 1723 using each pin's individual Coarse Capture Clock. The Coarse Capture Clocks 1780, 1781, 1782, through 1783, are generated by coarse delay element B1 1710, coarse delay element B2 1711, coarse delay element B3 1712, through coarse delay element Bn 1713, respectively.

The per-pin coarse delay elements 1710 through 1713 generate coarse data transition placement prior to the more precise transition placement generated by programmable delay element AA 1545. The coarse delay elements may be programmed during test setup, and usually keep their values for the duration of an IC test, that is, they are not programmable during the test.

In this embodiment, Coarse delay elements 1710 through 1713 would lack the inherent resolution and accuracy for testing, and are supplemented by the programmable delay element BA 1745. Programmable delay element 1745 receives an input from the output of AND Gate BB 1755, which in turn has inputs Capture Clock Enable 1765 and Clock 1750.

Testing for a delay of a specific signal from the circuit under test is accomplished by selecting the proper location in memory BC 1770 that contains the appropriate value for testing the targeted pin's low to high or high to low transition. This value causes programmable delay element BA 1745 to position the Data Capture Clock to the appropriate time position to latch the signal data into latches 1730 through 1733. This output data from latches 1730 through 1733 is subsequently loaded into registers 1720 through 1723, respectively, on the positive transition of each pin's coarse clock, which were generated by delay elements 1710 through 1713. The output of registers 1710 through 1723 is then compared with the expected data from pattern memory.

The combination of the single programmable time event generator 1701 and a plurality of coarse capture circuits 1702, can be used to reposition in time sample events that capture the state of data being received from a set of pins of a circuit under test.

Figure 12:
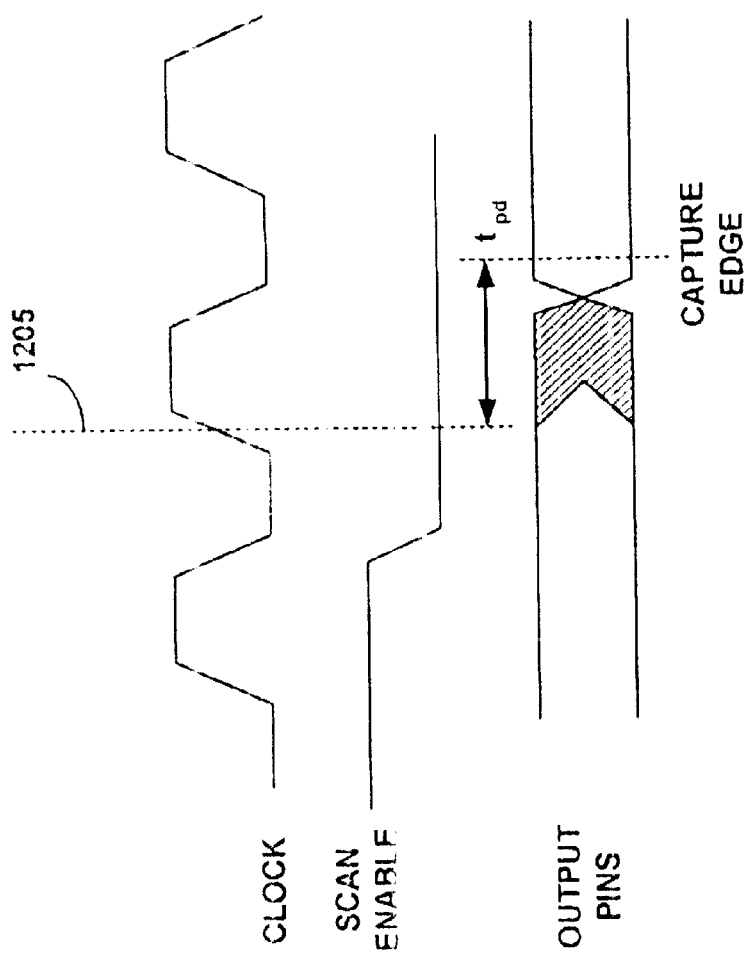
FIG. 12 shows an example of an output pin timing test using scan based testing.
Figure 18:
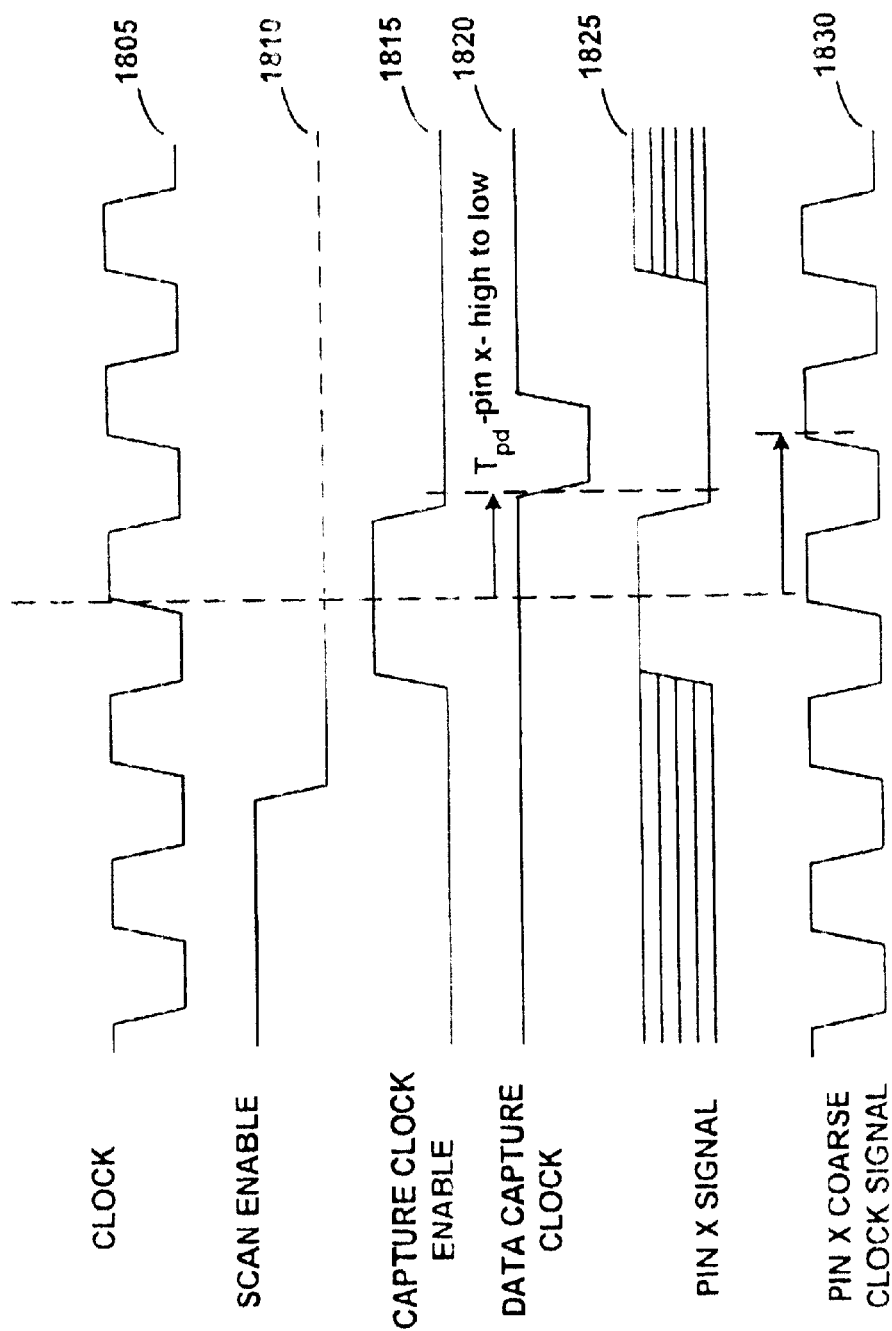
FIG. 18 depicts an example set of waveforms 1800 associated with a clock that may be generated in accordance with an embodiment of the present claimed invention.

FIG. 18 depicts an example set of waveforms 1800 associated with a clock 1805 that may be generated in accordance with an embodiment of the present invention to test output pin propagation delay time as previously described in Prior Art FIG. 12. Normally, the Data Capture Clock 1820 is maintained in a high state, which allows the data 1825 to be normally sampled on the positive edges of the Coarse Data Capture Clock 1830 when the scan enable 1810 is low. However, during a test pattern sequence where the delay of the output on a specific pin needs to be more accurately tested, the more precise global Data Capture Clock 1820 is enabled by the Capture Clock enable 1815 going high. The low going transition of the Data Capture Clock latches the data into Latches 1730 through 1733, and the subsequent positive transition of the Coarse Data Capture Clocks transfers this data into 1720 through 1723 prior to the Data Capture Clock 1820 going high again.

A system may also combine some of the elements shown in FIG. 15 and FIG. 17, such as the memory (AC 1570, BC 1770) and programmable delay element (AA 1545, BA 1745) that are common to both.

Figure 19:
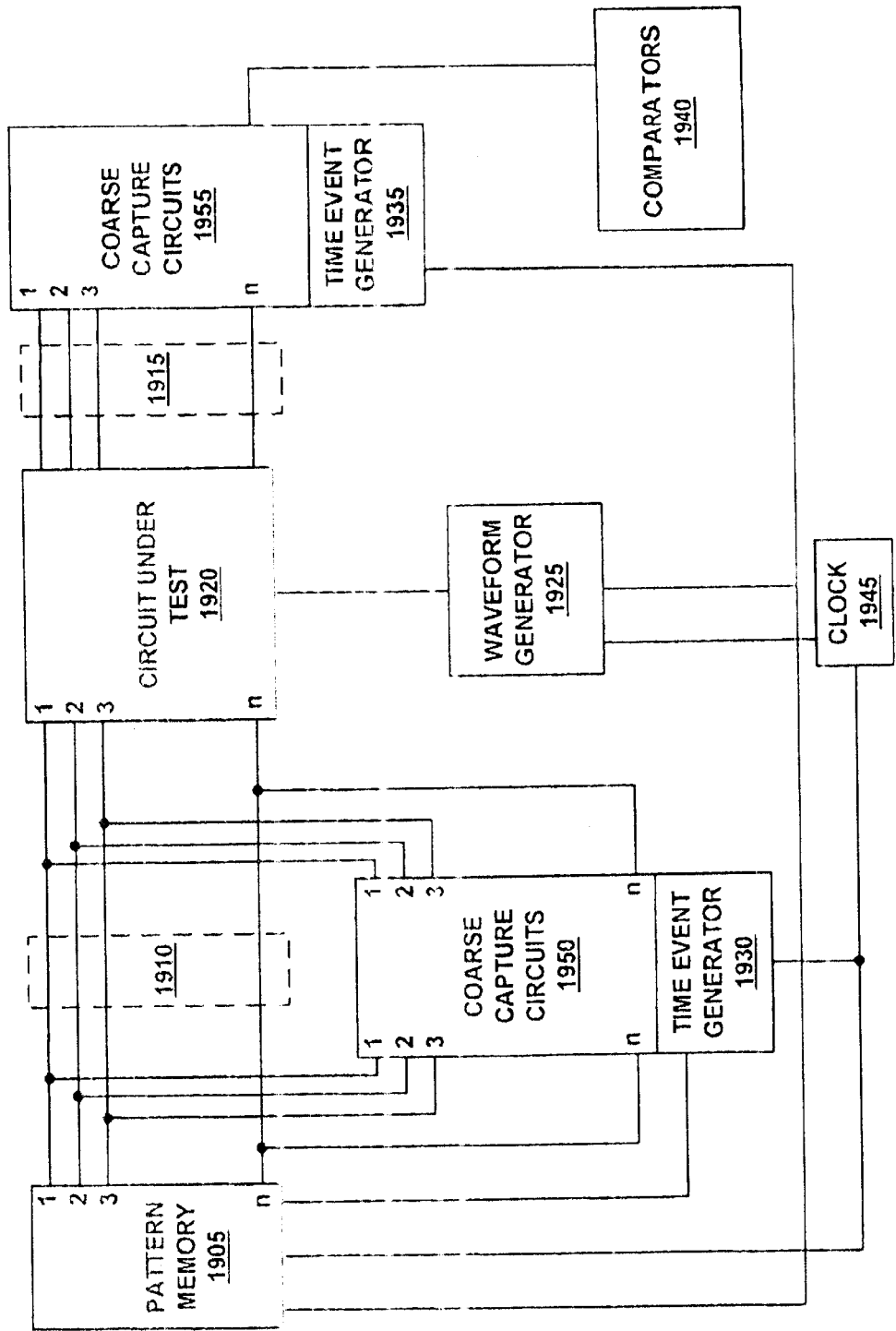
FIG. 19 depicts a partial schematic 1900 of an ATE that incorporates embodiments of the present claimed invention.

FIG. 19 shows a partial schematic 1900 of an example ATE that incorporates embodiments of the present invention. A circuit under test 1920, a pattern memory 1905, and coarse input circuits 1950 (coupled to input time event generator 1930), are coupled to an input bus 1910. Coarse capture circuits 1955 (coupled to output time event generator 1935) are coupled to the circuit under test 1920 by an output bus 1915. The input bus 1910 and output bus 1915 have lines for 1-n pins. The coarse capture circuits 1955 are also coupled to a set of comparators 1940. A master clock 1945 is coupled to the pattern memory 1905, input timing event generator 1930, output timing event generator 1935 and a waveform generator 1925. The waveform generator 1925 is also coupled to the circuit under test 1920.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. A programmable clock waveform generator circuit for an automated test equipment (ATE) system comprising:
   a first serial in/parallel out shift register;
   a first programmable delay element having an input and an output, wherein said input is coupled to said serial in/parallel out shift register; and
   a first AND gate having an input coupled to said output of said programmable delay element wherein said AND gate generates a clock waveform signal based on data to re-program said first programmable delay element in between scan patterns stored in a pattern memory and wherein said clock waveform signal is for application to a tester access pin of said ATE system and wherein said pattern memory is coupled to said serial in/parallel out shift register and wherein said pattern memory contains said data to re-program said first programmable delay element in between scan patterns.

2. The circuit of claim 1, wherein said pattern memory contains test pattern data for scan based testing.

3. The circuit of claim 1, further comprising:
   a second serial in/parallel out shift register coupled to said pattern memory;
   a second programmable delay element having an input and an output, wherein said input is coupled to said second serial in/parallel out shift register; and
   a second AND gate having an input, wherein said input is coupled to said output of said second programmable delay element and wherein said AND gate generates a timing signal based on data stored in said pattern memory, and,
   an OR gate coupled to said first AND gate and to said second AND gate wherein said OR gate is for supplying said timing signal to said tester pin.

4. The circuit of claim 3, further comprising a clock driver coupled to said OR gate.

5. A programmable clock waveform generator circuit for use in an Automatic Test Equipment (ATE) system comprising:
   a plurality of clock signal waveform generators for generating a plurality of clock waveform signals each individually programmable and being individually enabled;
   a selector circuit for selecting an output of said plurality of signal waveform generators, said selector circuit for supplying a selected clock waveform signal to a first tester pin of said ATE system; and
   a pattern memory unit coupled to a serial in/parallel out shift register of each clock signal waveform generator to program said plurality of signal waveform generators and coupled to supply test pattern data to a plurality of tester access pins of said ATE system, said memory unit comprising test pattern data and also comprising timing data used to program said plurality of signal waveform generators in between scan patterns wherein said timing data used to program said plurality of signal waveform generators comprise relative timing positions for said plurality of signal waveform generators.

6. A programmable clock waveform generator circuit as described in claim 5 wherein said memory unit further comprises control data for enabling said plurality of signal waveform generators.

7. A programmable clock waveform generator circuit as described in claim 6 wherein each accessed location of said memory unit comprises associated pattern data, timing data and control data.

8. A programmable clock waveform generator circuit as described in claim 5 wherein said plurality of signal waveform generators are capable of generating signal waveform transitions with specified adjustable timing that is relative to previous signal waveform transitions of said tester pin.

9. A programmable clock waveform generator circuit as described in claim 5 wherein said plurality of signal waveform generators are capable of generating signal waveform transitions with specified adjustable timing that is relative to previous signal waveform transitions of another tester pin.

10. A programmable clock waveform generator circuit as described in claim 5 wherein one of said plurality of signal waveform generators is re-programmable by said memory unit while another of said plurality of signal waveform generators is enabled.

11. A programmable clock waveform generator circuit as described in claim 5 wherein each of said plurality of signal waveform generators comprise:
    a circuit comprising an input for receiving serial programming data and a parallel output;
    a delay element coupled to said parallel output; and
    an enable circuit coupled to an output of said delay element.

12. A programmable clock waveform generator circuit for an automated test equipment (ATE) system comprising:
    a plurality of individually programmable clock waveform generator circuits, each comprising a serial input and an output;
    a pattern memory coupled to each of said serial inputs and containing scan data and also test data for programming said waveform generator circuits in between scan patterns wherein said memory also contains enable data for enabling one of said waveform generator circuits to drive a tester access pin and wherein said test data comprises values for specifying the relative timing positions for the signal waveform generator circuits; and
    an enable circuit coupled to the outputs of said individually programmable clock waveform generator circuits for selecting an output for driving a said tester access pin of said ATE system.

13. The system of claim 12, wherein said enable circuit comprises an OR gate.

14. The system of claim 12, wherein each of said programmable clock waveform generator circuits comprise a respective programmable delay element.

15. The system of claim 14, wherein each of said clock waveform generator circuits further comprise a respective serial in/parallel out shift register.

* * * * *